United States Patent [19]
Arkin et al.

[11] Patent Number: 5,280,486
[45] Date of Patent: Jan. 18, 1994

[54] HIGH SPEED FAIL PROCESSOR

[75] Inventors: Brian J. Arkin, Simi Valley; Benjamin J. Brown, Westlake Village; Peter A. Reichert, Newbury Park, all of Calif.

[73] Assignee: Teradyne, Inc., Boston, Mass.

[21] Appl. No.: 15,070

[22] Filed: Feb. 8, 1993

Related U.S. Application Data

[63] Continuation of Ser. No. 861,758, Apr. 1, 1992, abandoned, which is a continuation of Ser. No. 494,601, Mar. 16, 1990, abandoned.

[51] Int. Cl.$^5$ .......................................... G01R 31/28
[52] U.S. Cl. ........................... 371/29.1; 371/16.5; 371/21.6; 371/22.6
[58] Field of Search .................. 371/29.1, 16.5, 21.6, 371/22.6; 395/575

[56] References Cited

U.S. PATENT DOCUMENTS

| | | | |
|---|---|---|---|
| 4,453,213 | 6/1984 | Romagosa | 371/29.1 |
| 4,709,366 | 11/1987 | Scott et al. | 371/29.1 |
| 4,817,418 | 4/1989 | Asami et al. | 371/29.1 |
| 4,876,685 | 10/1989 | Rich | 371/29.1 |

*Primary Examiner*—Charles E. Atkinson

[57] ABSTRACT

An apparatus for processing failure information received from a node of a circuit under test. The apparatus includes a fail processor which receives test data from a node and generates failure data based upon the test data, a plurality of fail memories, each memory being configured to receive and store certain fail data, and a sequence memory configured-to store sequence information indicating in what order the failure data is stored in the plurality of fail memories.

4 Claims, 2 Drawing Sheets

MODE=STORE ALL

| CYCLE | LOCATION OF FAILURE INFORMATION |
|---|---|
| 0 | memory 76 address 0 |
| 2 | memory 76 address 1 |
| 4 | memory 76 address 2 |
| 6 | memory 76 address 3 |
| 8 | memory 76 address 4 |

| CYCLE | LOCATION OF FAILURE INFORMATION |
|---|---|
| 1 | memory 78 address 0 |
| 3 | memory 78 address 1 |
| 5 | memory 78 address 2 |
| 7 | memory 78 address 3 |
| 9 | memory 78 address 4 |

FIG. 2

MODE=STORE THIS VECTOR OR STORE ONLY FAILS OR BOTH

| CYCLE | LOCATION OF FAILURE INFORMATION |
|---|---|
| 18 | memory 76 address 0 |
| 26 | memory 76 address 1 |
| 28 | memory 76 address 2 |

| CYCLE | LOCATION OF FAILURE INFORMATION |
|---|---|
| 5 | memory 78 address 0 |
| 9 | memory 78 address 1 |
| 15 | memory 78 address 2 |
| 17 | memory 78 address 3 |
| 19 | memory 78 address 4 |

FIG. 3

MODE=STORE THIS VECTOR OR STORE ONLY FAILS OR BOTH
(with sequence bit)

| CYCLE | LOCATION OF FAILURE INFORMATION | SEQUENCE BIT |
|---|---|---|
| 18 | memory 76 address 0 | 1 |
| 26 | memory 76 address 1 | 1 |
| 28 | memory 76 address 2 | 0 |

| CYCLE | LOCATION OF FAILURE INFORMATION | SEQUENCE BIT |
|---|---|---|
| 5 | memory 78 address 0 | 0 |
| 9 | memory 78 address 1 | 0 |
| 15 | memory 78 address 2 | 0 |
| 17 | memory 78 address 3 | 0 |
| 19 | memory 78 address 4 | 1 |

FIG. 4

HIGH SPEED FAIL PROCESSOR

This application is a continuation of application Ser. No. 861,758, filed Apr. 1, 1992 now abandoned, which is a continuation of application Ser. No. 494,601, filed Mar. 16, 1990.

BACKGROUND OF THE INVENTION

The invention relates to fail processors.

It is known to generate patterns which are used in automatic test equipment by providing a high speed pattern generator which generates address sequences which are sent to a plurality of local generator circuits. Each local generator circuit includes a high speed local memory, a multiplicity of timing generators, a multiplicity of corresponding interpolators, a high speed formatter and a high speed fail processor. The timing generators and interpolators run in an interleaved fashion, with one timing generator/interpolator set receiving and generating all even cycle information and the other set receiving and generating all odd information.

SUMMARY OF THE INVENTION

It has been discovered that providing a fail processor which receives test data from a node and generates failure data based upon the test data, a plurality of fail memories, each memory being configured to receive and store certain fail data, and a sequence memory configured to store sequence information indicating in what order the failure data is stored in the plurality of fail memories provides an apparatus for processing failure information received from a node of a circuit under test.

DESCRIPTION OF THE PREFERRED EMBODIMENT

The attached drawings illustrate the preferred embodiment, the structure and operation of which is then described.

DRAWINGS

FIGS. 2-4 are examples of how failure information is stored in the FIG. 1 test system.

STRUCTURE

Figure 1:
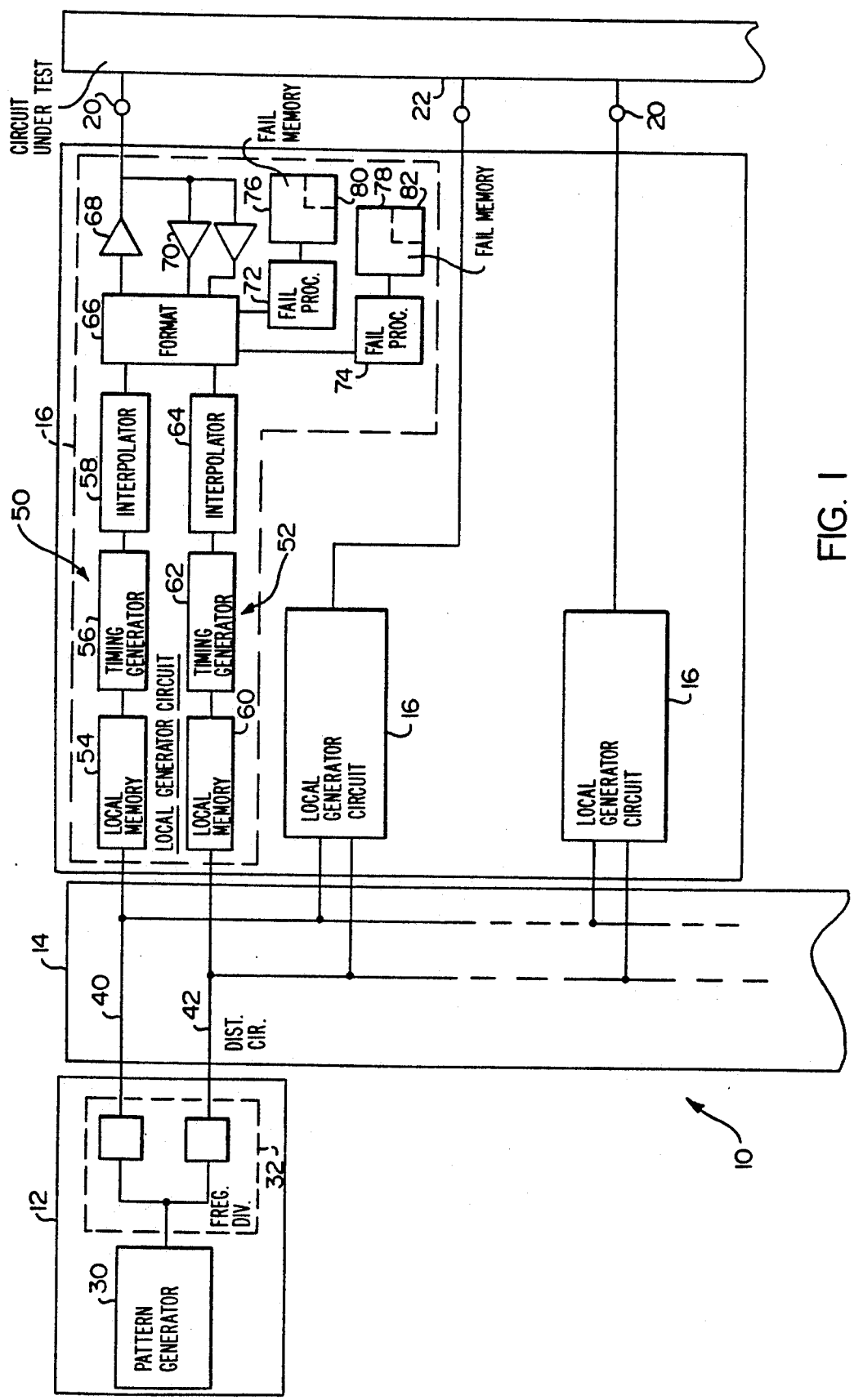
FIG. 1 is a schematic-block diagram of a test system according to the present invention.

Referring to FIG. 1, test system 10 includes pattern generator circuit 12, distribution circuit 14 and a plurality of local generator circuits 16. Each local generator circuit provides a signal at node 20 to a circuit under test (CUT) 22.

Pattern generator circuit 12 includes conventionally designed high speed pattern generator 30 which provides address patterns at a frequency of 122.0703125 MHz (generally, and hereinafter, referred to as "120 MHz", and its half as "60 MHz") and frequency divider circuit 32 which receives the high frequency patterns generated by pattern generator 30 and provides a pair of lower frequency addresses which are half the frequency (i.e., 60 MHz) of the high frequency addresses generated by pattern generator 30.

Distribution circuit 14 includes a pair of signal distribution paths 40, 42. Each signal distribution path 40, 42 includes a parallel-multibit bus which simultaneously provides the lower frequency address to d plurality of local generator circuits 16.

Each local generator circuit 16 includes a pair of signal generating circuits 50, 52. Signal generating circuit 50 includes local memory 54, which receives information from distribution path 40 and provides a data output to timing generator 56, timing provides a timing generator output to interpolator circuit 58. Likewise, signal path 52 includes local memory 60, which receives information from distribution path 42, timing generator 62, which receives information from local memory 60, and interpolator circuit 64, which receives information from timing generator 62.

Interpolator circuits 58 and 64 provide signals to high speed formatter 66. Formatter 66 is a conventional emitter coupled logic (ECL) high speed formatter which receives timing pulses and data and provides a two bit waveform indicating level and tristate at a particular time. Driver 68 receives these signals, and provides an output to node 20 having the correct voltage levels and tristate conditions for the particular CUT.

Dual detector 70 is also connected to node 20; dual detector 70 receives signals from node 20 and provides an output to high speed formatter 66. High speed formatter 66 is also connected to a pair of fail processors 72, 74. Fail processors 72, 74 include respective fail memories 76, 78. Each fail memory 76, 78 includes sequence memory portion 80, 82.

OPERATION

Referring to FIG. 1, system 10 both provides signals to and detects information from node 20 of a CUT. More specifically, when providing signals to node 20, pattern generator 30 generates address patterns at a frequency of 120 MHz. This is provided to frequency divider circuit 32 which receives the 120 MHz address pattern and alternating cycles of half speed (i.e., 60 MHz; address patterns to signal distribution paths 40, 42, respectively. Alternate cycles move respectively over lines 40 and 42, even over the former and odd over the latter; and successive cycles are identified, by their leading edges. Because the pattern is frequency divided prior to transmission to local generators 16, signal distribution paths 40,: 42 need only be appropriate for transmitting signals having a frequency of 60 MHz rather than signals having a frequency of 120 MHz.

At power-up and at the start-up of each pattern burst, system 10 is resynchronized. More specifically, frequency divider circuit 32 is configured so that at power-up, as well as when it is resynchronized, the next signal provided by frequency divider circuit 32 is over signal path 40.

Distribution circuit 14 provides the two half speed address patterns generated by divider circuit 32 to 512 channels. Each channel includes a local generator circuit 16, as shown in FIG. 1.

Each local generator circuit 16 provides a high frequency signal to, and detects a high frequency signal from, node 20. When detecting signals from node 20, dual detector receives the high frequency signal and provides the high frequency signal to formatter 66. Formatter 66 provides two half speed signals to fail processors 72, 74; the half speed signals correspond to the cycles of the half speed address patterns. Fail processors store the failure information in fail memories 76, 78, which function independently at half the speed of formatter 66. Because fail memories 76, 78 function at half the speed of formatter 66, lower cost memories may be used.

Information may be stored in fail memories 76, 78 in one of three modes of operation. In a store all (Store All) mode, failure information is continually, alternately written into successive locations of fail memories 76, 78. FIG. 2 shows an example of how the failure information is stored in the Store All mode. In a store this vector (STV) mode, failure information is selectively written into the fail memories based upon the value of a vector bit. In a store only fail (SOF) mode, failure information is written into fail memories 76, 78 on cycles which contain a fail. Or, there may be chosen a combined STV and SOF mode. FIG. 3 shows an example of how the failure information is stored in fail memories 76, 78 for the STV mode and the SOF mode. It is apparent from FIG. 3 that in the STV mode and the SOF mode the failure information is stored in the fail memory which corresponds to the cycle in which the information was generated. Accordingly, to reconstruct the sequence in which the failure information was stored in fail memories 76, 78 further information. is necessary.

In order to reconstruct the failure information storage sequence, fail memories 76, 78 use respective sequence memory portions 80, 82. FIG. 4 shows an example of how the failure and sequence information is stored in fail memories 76, 78 and sequence memory portions 80, 82. Sequence memory portions 80, 82 allow the failure information storage sequence to be reconstructed by tracking the failure information as the information is stored. More specifically, a low is stored in a respective sequence memory portion if the previous write was in the same path. A high is stored in a respective sequence memory portion if the previous write was in the other path. By using this information, the failure information storage sequence can be easily reconstructed.

OTHER EMBODIMENTS

Fail processors 72, 74 may be connected to a common sequence memory. By centrally storing the sequence information, the fail memories may operate independently. Additionally, because the sequence information is centrally stored, fail memories 72, 74 may be distributed without providing local means for determining the sequence of stored bits.

Additionally, while the preferred embodiment includes two signal generation paths, the system may operate with one signal generation path but a plurality of fail processors. In such a system, the failure information may be stored at a lower frequency than the generated patterns.

Additionally, while the preferred embodiment includes two fail processors and two fail memories, the system may also operate with one fail processor and two fail memories. In such a system, the failure information may be stored at a lower frequency than that at which the fail processor operates.

Additionally, while the preferred embodiment shows two fail memories, the number of fail memories may be increased simply by providing more bits to a sequence memory; the bits indicate where in which memory previous write is located.

What is claimed is:

1. Apparatus for testing a node of a circuit under test comprising
    a high-speed formatter including means for generating a high-speed test signal for application to a driver connected to said node in response to test pattern information received from a pattern generator, means for receiving a high-speed detected test signal from a detector connected to said node, and means for generating two half-speed detected test signals that contain alternate cycles of said high-speed detected test signal,
    first and second fail processor means connected to said high-speed formatter to receive respective half-speed detected signals for generating and outputting failure information based upon the states of cycles of said half-speed detected test signals,
    said failure information outputted by a particular fail processor means relating to specific, but not necessarily all, cycles of its respective half-speed detected test signal,
    first and second fail memory means connected to respective said first and second fail processor means for receiving said failure information from respective said fail processor means and for storing said failure information for specific cycles received from said fail processor means in successive memory locations, and
    sequence means for storing information indicating the sequence in which failure information is stored in said first and second fail memory means.

2. The apparatus of claim 1 wherein said sequence means stores said information indicating the sequence as said first and second fail memory means store said failure information.

3. The apparatus of claim 1 wherein said sequence means comprises first and second sequence memory means associated with respective said first and second memory means, said sequence means storing sequence bits in said sequence memory means associated with said failure information for specific cycles, said sequence bits indicating whether the previously stored failure information is stored in the same fail memory means or not.

4. The apparatus of claim 3 wherein said sequence means stores a single sequence bit for failure information for a specific cycle.

* * * * *

UNITED STATES PATENT AND TRADEMARK OFFICE
CERTIFICATE OF CORRECTION

PATENT NO. : 5,280,486

DATED : January 18, 1994

INVENTOR(S) : Brian J. Arkin et al.

It is certified that error appears in the above-identified patent and that said Letters Patent is hereby corrected as shown below:

On the Title Page, item [75], inventor Brian Arkin's address should be --Pleasanton-- not "Simi Valley"

Column 1, line 45, "of-how" should be --of how--;

Column 1, line 67, "d" should be --a--;

Column 2, line 5, after the second "timing", the line --generator 56 which receives the data output and-- should be inserted;

Column 2, lines 16 and 19, "tristate" should be --tri-state--;

Column 2, line 24, "12" should be --72--;

Column 2, line 33, after "This" insert --information--;

Column 2, line 35, after "and" insert --provides two--;

Column 2, line 36, ";" should be --)--;

UNITED STATES PATENT AND TRADEMARK OFFICE
CERTIFICATE OF CORRECTION

PATENT NO. : 5,280,486

DATED : January 18, 1994

INVENTOR(S) : Brian J. Arkin et al.

It is certified that error appears in the above-identified patent and that said Letters Patent is hereby corrected as shown below:

Column 2, line 39, delete the "," after "identified";

Column 2, line 42, "40,: 42" should be --40, 42--;

Column 2, line 48, "Dow-" should be --pow---;

and

Column 3, line 21, delete the "." after "information".

Signed and Sealed this

Second Day of August, 1994

Attest:

BRUCE LEHMAN

*Attesting Officer*    Commissioner of Patents and Trademarks